United States Patent
Ogata

(10) Patent No.: US 6,313,903 B1
(45) Date of Patent: Nov. 6, 2001

(54) RESIST COATING AND DEVELOPING UNIT

(75) Inventor: Kunie Ogata, Kanagawa-Ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/493,248

(22) Filed: Jan. 28, 2000

(30) Foreign Application Priority Data

Feb. 1, 1999 (JP) .................................................. 11-024178

(51) Int. Cl.⁷ .......................... G03B 27/32; G03B 17/24; B05C 11/02
(52) U.S. Cl. ................................ 355/27; 396/311; 118/52
(58) Field of Search ............... 355/27–29; 396/611–612; 414/937–939; 118/52, 320

(56) References Cited

U.S. PATENT DOCUMENTS

| | | | |
|---|---|---|---|
| 5,393,624 | * | 2/1995 | Ushijima .................................. 430/30 |
| 6,161,969 | * | 12/2000 | Kimura et al. ......................... 396/611 |
| 6,197,372 | * | 3/2001 | Akimoto et al. ....................... 427/240 |
| 6,198,981 | * | 3/2001 | Nakamura et al. ................... 700/121 |

FOREIGN PATENT DOCUMENTS 10-043666  2/1998  (JP) .
10-275755  10/1998  (JP) .

* cited by examiner

Primary Examiner—Russell Adams
Assistant Examiner—Hung Henry Nguyen
(74) Attorney, Agent, or Firm—Rader, Fishman & Grauer PLLC

(57) ABSTRACT

In a transferring region of a wafer transferring portion that transfers a wafer placed in a carrier loading and unloading portion, a pattern inspecting portion for inspecting a resist pattern and a carrier for accommodating a wafer determined as an unacceptable wafer are disposed. The carrier is conveyed to an external cleaning portion. Resist on the unacceptable wafer is cleaned and removed. The resultant wafer is loaded to the coating and developing unit. The film thickness of a monitor wafer is measured by a film thickness measuring portion disposed in the coating and developing unit. Thereafter, resist on the entire surface of the monitor wafer is removed with thinner supplied from a solvent nozzle. Thus, the monitor wafer is regenerated. Consequently, when the coating and developing unit is operated and a substrate and a monitor substrate that have been processes are inspected, the throughput of the coating and developing unit becomes high and the processes can be automatically performed.

18 Claims, 13 Drawing Sheets

PRIOR ART

RESIST COATING AND DEVELOPING UNIT

BACKGROUND OF THE INVENTION

1. Field of the Invention

The present invention relates to a resist coating and developing unit for forming a resist film on a substrate, developing a substrate that has been exposed, and forming a desired pattern on the developed substrate.

2. Description of the Related Art

In a fabrication process for a semiconductor device, the photolithography process is used. In the photolithography process, resist solution is coated on a substrate such as a semiconductor wafer. With a photo-mask, the resist film is exposed. The exposed resist film is developed. Thus, a resist mask having a desired pattern is formed on the substrate.

The photolithography process is performed by a system of which a coating and developing unit 1A and an exposing unit 1B are connected as shown in FIG. 13. When a semiconductor wafer (hereinafter referred to as wafer) is processed, the coating and developing unit 1A comprises a loading and unloading portion 11, a transferring arm 12, a coating and developing portion 13, and an interface portion 14. The loading and unloading portion 11 loads and unloads a wafer carrier C to/from the coating and developing unit 1A. The transferring arm 12 removes a wafer from the carrier C placed at the loading and unloading portion 11. The coating and developing unit 1A is connected to the exposing unit 1B. When a wafer W is transferred to the coating and developing portion 13 through the transferring arm 12, the coating and developing portion 13 forms a resist film on the wafer W. The resultant wafer W is transferred to the exposing unit 1B. The exposing unit 1B exposes the resist film. Thereafter, the resultant wafer W is returned to the coating and developing portion 13. The coating and developing portion 13 develops the resist film on the wafer W. The resultant wafer W is returned to the carrier C.

After the processed wafer W has been accommodated to the carrier C, the operator or automatic transferring robot transfers the carrier C from the loading and unloading portion 11 to an inspecting unit 15. The inspecting unit 15 inspects the line width of the resist pattern formed on the wafer W, the overlap of the resist pattern and base pattern, coating irregularity of resist, developing defect, and so forth. When the inspected result of the wafer W is acceptable, the wafer W is transferred to the next process. When the inspected result of the wafer W is unacceptable, the wafer W is transferred to a cleaning unit 16. Since a plurality of devices are formed as a plurality of layers on the wafer W, the wafer W is loaded and unloaded to/from the coating and developing system several ten times. Thus, the cleaning unit 16 uses a plurality of kinds of chemicals corresponding to the processes. The wafer W is immersed with a relevant solution. Thus, the resist is dissolved and removed. Consequently, the wafer W is regenerated to the pre-state of the coating and developing processes. Thereafter, the wafer W is transferred to the coating and developing system. In the coating and developing system, the same processes are performed.

In the coating and developing unit, a monitor wafer is used besides a product wafer. After a resist film is formed on the monitor wafer, the monitor wafer is transferred from the loading and unloading portion 11 to the inspecting unit 15. The inspecting unit 15 inspects the film thickness of the resist film on the monitor wafer so as to adjust the number of rotations of a spin chuck of the resist solution coating unit. After the film thickness of the monitor wafer has been inspected, the monitor wafer is transferred to the cleaning unit 16. The cleaning unit 16 dissolves and removes the resist film on the monitor wafer. Thus, the monitor wafer is recycled.

However, since a carrier C is transferred from the conventional coating and developing system to the inspecting unit 15 and wafers W accommodated in the carrier C are removed and inspected one by one in the inspecting unit 15. Thus, the throughput of the system is low. In addition, when the resist coating unit is adjusted with a monitor wafer, it is transferred from the coating and developing system to the inspecting unit. After the film thickness of the resist film of the monitor wafer is inspected, the resist film is manually cleaned and removed and then the resultant wafer is returned to the coating and developing system. Thus, the operator should walk between the coating and developing system and the external inspecting unit. In addition, the operator should manually clean the monitor wafer. Thus, in the conventional system, the operator should perform troublesome operations. Moreover, it is difficult to automatically perform such operations.

SUMMARY OF THE INVENTION

An object of the present invention is to provide a technology that allows a developing unit and an inspecting unit to process and inspect product substrates and monitor substrate with high throughput and automatically.

A first aspect of the present invention is a coating and developing unit for coating resist on a substrate and developing the resist exposed by a exposing unit connected to the coating and developing unit, the coating and developing unit comprising a carrier loading and unloading portion for loading and unloading a carrier that accommodates a plurality of substrates, a coating portion for coating resist on a substrate removed from a carrier transferred from said carrier loading and unloading portion, a developing portion for developing the resist on the substrate exposed by said exposing unit and forming a predetermined resist pattern, transferring means for transferring the substrate among said carrier loading and unloading portion, said coating portion, and said developing portion, a pattern inspecting portion for inspecting a resist pattern formed on the substrate and determining whether or not the resist pattern is acceptable, and a separating means for separating a substrate determined as an unacceptable substrate by said pattern inspecting portion from a substrate determined as an acceptable substrate.

A second aspect of the present invention is a coating and developing unit for coating resist on a substrate and developing the resist exposed by a exposing unit connected to the coating and developing unit, the coating and developing unit comprising a carrier loading and unloading portion for loading and unloading a carrier that accommodates a plurality of substrates, a coating portion for coating resist on a substrate removed from a carrier transferred from said carrier loading and unloading portion, a developing portion for developing the resist on the substrate exposed by said exposing unit and forming a predetermined resist pattern, a transferring means for transferring the substrate among said carrier loading and unloading portion, said coating portion, and said developing portion, a monitor substrate accommodating portion for accommodating a monitor substrate, a film thickness measuring portion for measuring the film thickness of resist on the monitor substrate and determining whether or not the film thickness of the resist is proper, and a means for causing said transferring means to transfer the monitor substrate accommodated in said monitor substrate accommodating portion to said coating portion and said transferring means to transfer the monitor substrate with resist coated by said coating portion to said film thickness measuring portion.

A third aspect of the present invention is a coating and developing unit for coating resist on a substrate and developing the resist exposed by a exposing unit connected to the coating and developing unit, the coating and developing unit comprising a carrier loading and unloading portion for loading and unloading a carrier that accommodates a plurality of substrates, a coating portion for coating resist on a substrate removed from a carrier transferred from said carrier loading and unloading portion, a developing portion for developing the resist on the substrate exposed by said exposing unit and forming a predetermined resist pattern, a pattern inspecting portion for inspecting a resist pattern formed on the substrate and determining whether or not the resist pattern is acceptable, a separating means for separating a substrate determined as an unacceptable substrate by said pattern inspecting portion from a substrate determined as an acceptable substrate, a monitor substrate accommodating portion for accommodating a monitor substrate, a film thickness measuring portion for measuring the film thickness of resist on the monitor substrate and determining whether or not the film thickness of the resist is proper, and a means for transferring a monitor substrate accommodated in said monitor substrate accommodating portion to said coating portion, causing said coating portion to coat resist on the monitor substrate, conveying the resultant monitor substrate to said film thickness measuring portion, and causing said film thickness measuring portion to determine whether or not the film thickness of the monitor substrate is proper when a substrate determined by said pattern inspecting portion is unacceptable.

According to the present invention, since the coating and developing unit has a pattern inspecting portion and separates acceptable substrates from unacceptable substrates, an acceptable substrate that has been process can be quickly transferred to the next stage. In addition, while a carrier is being loaded or unloaded from the carrier loading and unloading portion, a pattern of a substrate can be inspected. Thus, in comparison with the case that substrates are removed one by one from a carrier and inspected with an external pattern inspecting portion, the throughput of the system according to the present invention is high.

In addition, according to the present invention, since the film thickness of a monitor wafer is measured in the coating and developing unit, the maintenance operation can be effectively performed.

These and other objects, features and advantages of the present invention will become more apparent in light of the following detailed description of a best mode embodiment thereof, as illustrated in the accompanying drawings.

DESCRIPTION OF PREFERRED EMBODIMENTS

Figure 1:
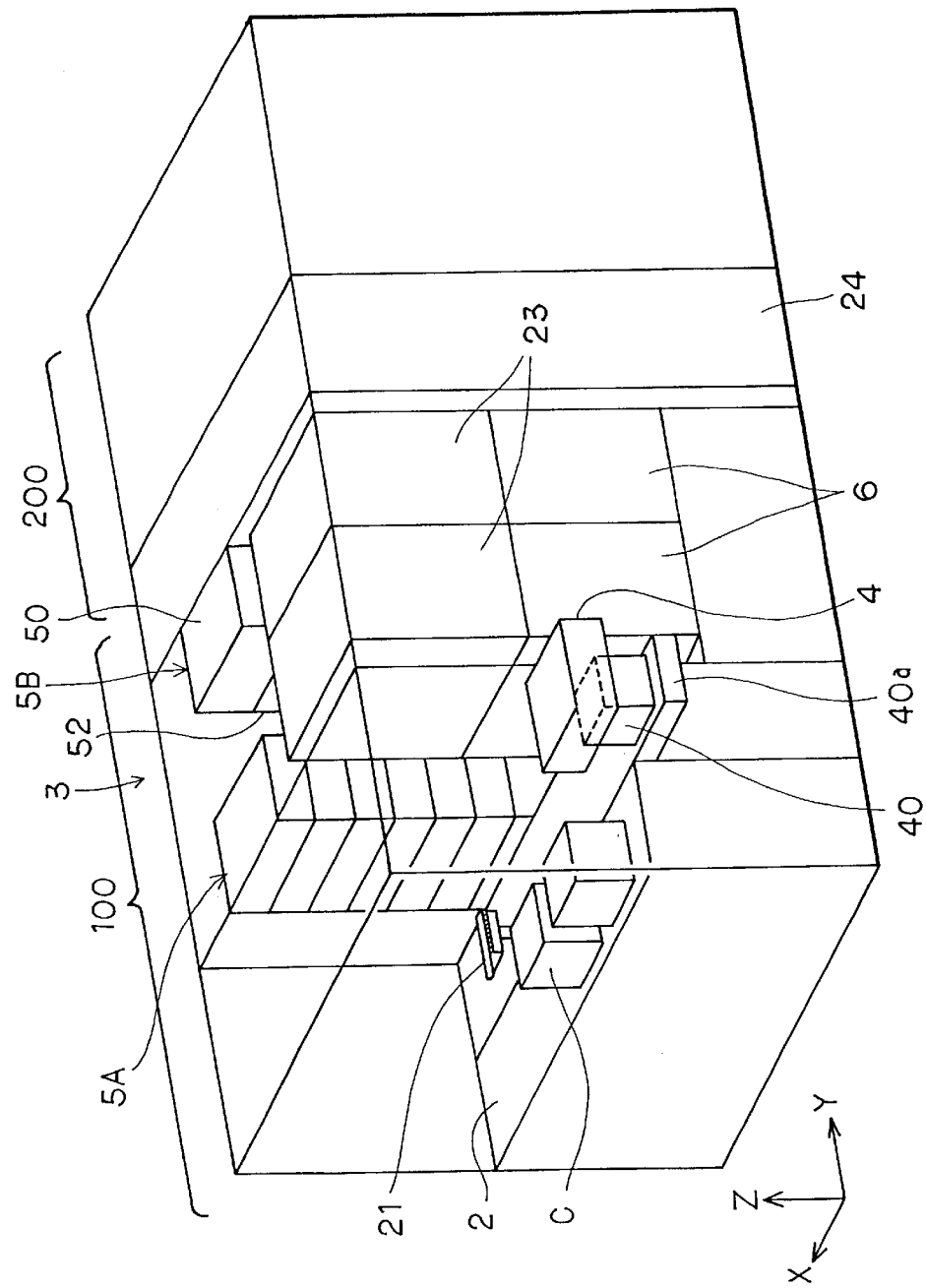
FIG. 1 is a perspective view showing the structure of a system of a coating and developing unit according to an embodiment of the present invention and an exposing unit are combined.
Figure 2:
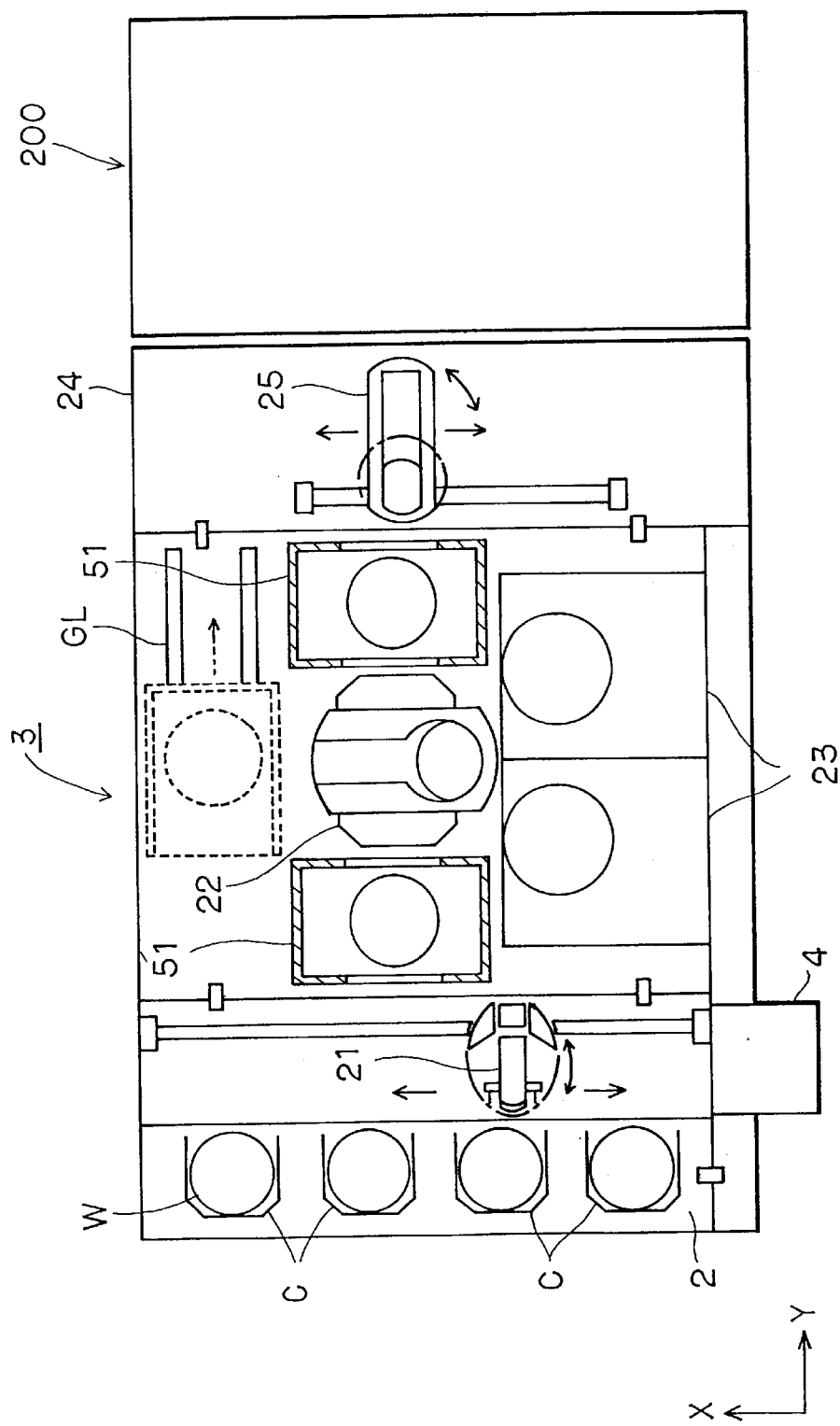
FIG. 2 is a plan view showing the internal structure of the system shown in FIG. 1.

As shown in FIGS. 1 and 2, a coating and developing unit 100 according to an embodiment of the present invention comprises a carrier loading and unloading portion 2, a processing portion 3, and a first wafer transferring portion 21. The carrier loading and unloading portion 2 loads and unloads a wafer carrier C (referred to as carrier) to/from the processing portion 3. The carrier C is a transferring vessel that accommodates a plurality of (for example, 25) wafers W as substrates in a shelf arrangement. The processing portion 3 performs a coating process and a developing process for a wafer W. The first wafer transferring portion 21 transfers a wafer W between the processing portion 3 and the carrier loading and unloading portion 2.

The carrier loading and unloading portion 2 is structured as a stage on which for example four carriers C are placed. The first wafer transferring portion 21 has a pedestal and an arm. The arm that is protrusible and retractable is disposed on the pedestal that is movable in the X, Y, and Z directions and rotatable in the vertical direction. In the transferring region of the first wafer transferring portion 21 (for example, at a side portion of the coating and developing unit), a pattern inspecting portion 4 is disposed. The pattern inspecting portion 4 inspects a resist pattern formed on a wafer W that has been developed. In the pattern inspecting portion 4, a wafer image photographed by for example a CCD camera is analyzed by a personal computer. For example, the pattern inspecting portion 4 (or a plurality of the pattern inspecting portions 4) inspects defects of wafers W that are sampled at a predetermined rate. In reality, the pattern inspecting portion 4 performs a total of 12 types of inspecting processes that are a defocus inspecting process (for detecting a misalignment of a pattern in the exposing unit 200), a coating irregularity inspecting process (for detecting coating irregularity of resist solution), a development defect inspecting process (for detecting a defect in the developing process), a scratch inspecting process (for detecting a small scratch on the front surface of a wafer W), a particle inspecting process (for detecting particles on a wafer W), a comet inspecting process (for detecting comets on the front surface of a resist coated wafer W due to bubbles and foreign matters in resist solution), a splash-back inspecting process (for detecting splash-back of which solvent of resist solution that splashes from the front surface of a wafer re-adheres to the wafer W), a common defect inspecting process (for detecting a common defect that takes place at the same position of the front surface of each wafer W), a scum inspecting process (for detecting resist scums that reside in a wafer W that has been developed), a clamping inspecting process (for detecting scratches due to a clamping operation of a wafer edge in the prior process of the photolithography process), a no-resist-no-develop inspecting process (for detecting that no resist coating process and a no developing process have been performed), and a line width measurement inspecting process (for measuring the line width of a resist film formed on a wafer W).

When the alignment accuracy of which a wafer W exposed by the exposing unit 200 is aligned with a photo mask is compared with a predetermined reference value, a dedicated alignment inspecting portion may be disposed. These inspecting processes are performed in two stages that are a macro inspecting stage and a micro inspecting stage. In the macro inspecting stage, a defect of for example 20 μm or larger can be detected. In the micro inspecting stage, a defect of for example 0.1 μm or larger can be detected.

In the defocus inspecting process, a pattern formed on a wafer W is compared with a predetermined correct pattern so as to detect a defocus state of the exposing unit. In the line width measurement inspecting process, a pattern formed on a wafer W is compared with a predetermined correct pattern so as to determine whether or not the exposure amount and the exposure time of the exposing unit are proper. In the alignment inspecting process, a pattern on for example a lower layer is compared with a predetermined correct pattern so as to detect a misalignment state of the exposing unit.

Figure 3:
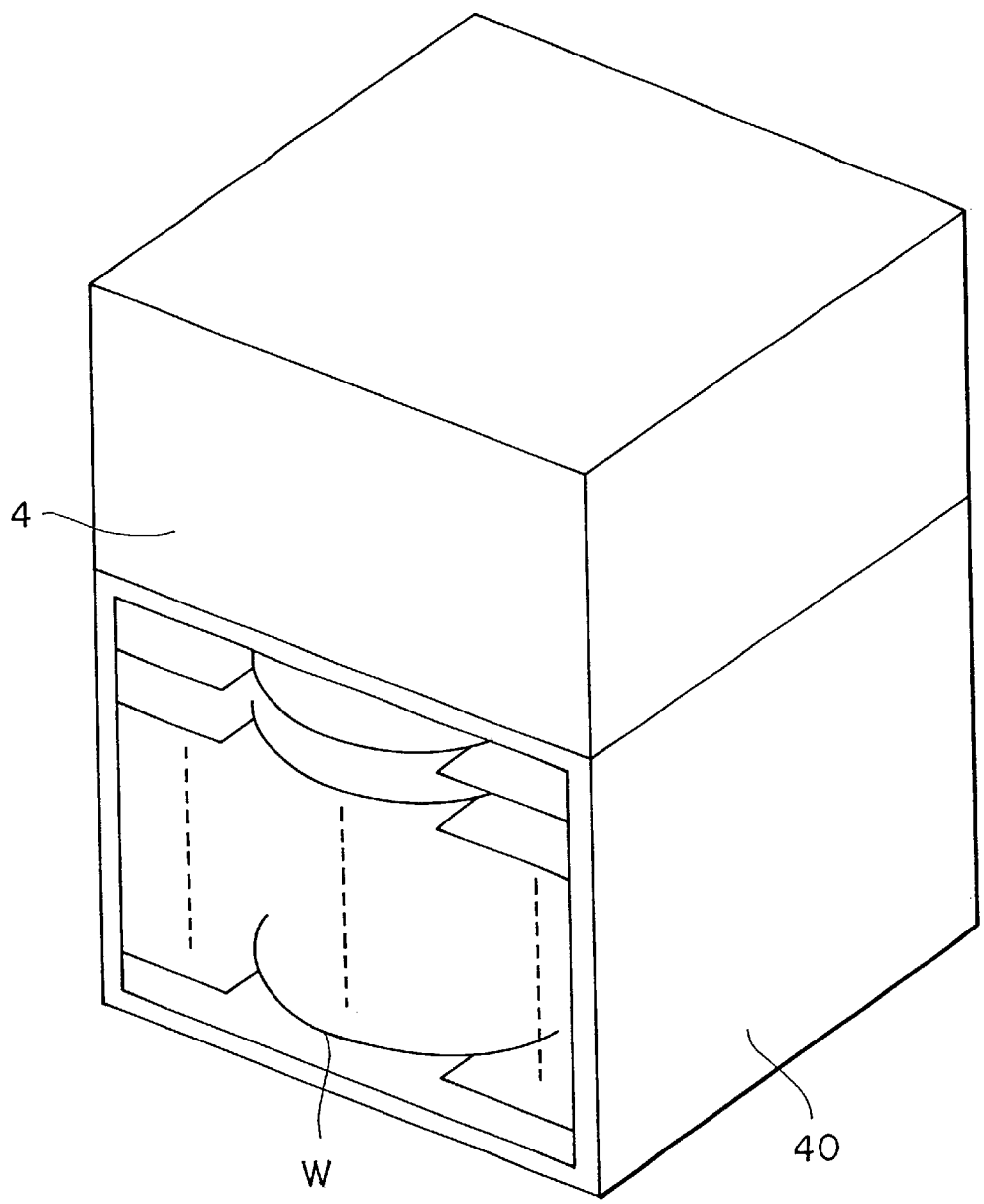
FIG. 3 is a perspective view showing the structures of a pattern developing unit and an unacceptable wafer accommodating carrier according to the embodiment of the present invention.

In the transferring region of the first wafer transferring portion 21 at a lower side position of the pattern inspecting portion 4, a carrier 40 that accommodates wafers W determined as unacceptable wafers W by the pattern inspecting portion 4 is placed on a table 40a. The structure of the carrier 40 is the same as that of each of the carriers C. As shown in FIG. 3, in this example, the first wafer transferring portion 21 and the carrier 40 compose a wafer separating means that separates wafers W determined as unacceptable wafers from wafers W determined as acceptable wafers.

Figure 4:
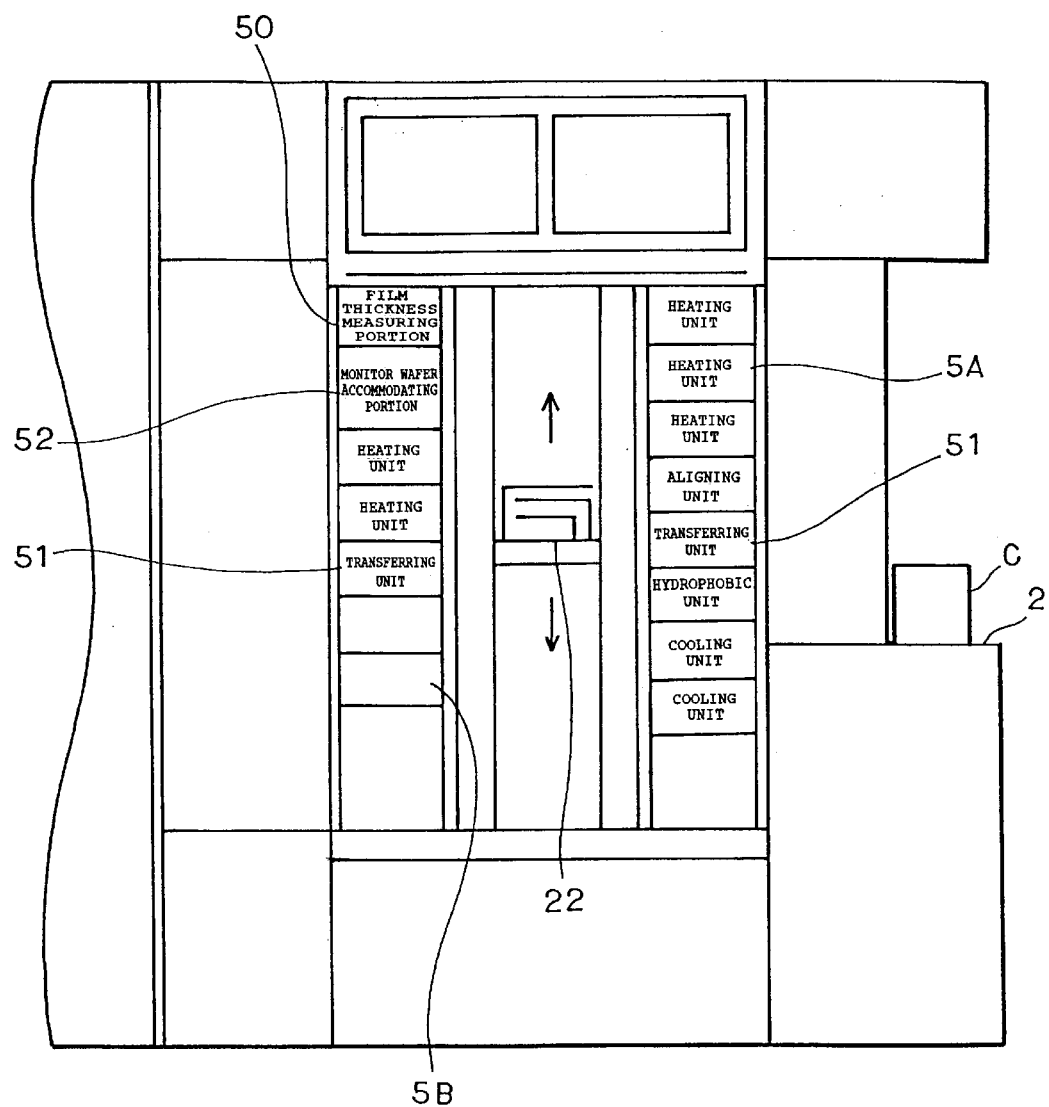
FIG. 4 is a side view showing the internal structure of the system according to the embodiment of the present invention.

The processing portion 3 has a second wafer transferring portion 22 (also referred to as main transferring arm). The second wafer transferring portion 22 is disposed at a center position of the processing portion 3. Shelves 5A and 5B are disposed in front of and behind the second wafer transferring portion 22 when the second wafer transferring portion 22 is viewed from the carrier loading and unloading portion 2. The shelves 5A and 5B are composed of a plurality of units that are piled up. As shown in FIG. 4, a heating unit (for heating a wafer W), an alignment unit (for aligning a wafer W), and so forth are disposed. In addition, one of the unit group is a transferring unit 51. The unit assignment shown in FIG. 4 is only an example. In other words, the present invention is not limited to such an assignment. For example, a heating unit and a cooling unit may be disposed on different shelves. In addition, as shown in FIG. 2, a shelf C whose structure is the same as that of each of the shelves 5A and 5B may be disposed so that the shelf C is slidably moved along a guide rail GL.

As shown in FIG. 4, a film thickness measuring portion 50 is disposed at the top shelf position of the shelf 5B (5A or 5C). Below the film thickness measuring portion 50, a monitor wafer accommodating portion 52 is disposed. The monitor wafer accommodating portion 52 accommodates a plurality of monitor wafers. The monitor wafers are dedicated wafers used for periodically inspecting parameters of a coating portion (that will be described later). The film thickness measuring portion 50 inspects the film thickness of a resist film formed on a monitor wafer. The film thickness measuring portion 50 is composed of a light interference film thickness meter including a dirk field illumination type microscope, a spectroscope, and a data processing portion. In the light interference film thickness meter, light of a light source is radiated to a wafer through an objective lens. The reflected light of the wafer enters the spectroscope. The entered reflection spectrum is analyzed by a computer so as to calculate the film thickness. For example, the light source of the film thickness measuring portion 50 is an optical diode.

On the right of the second wafer transferring portion 22, two developing portions 23 (as upper units) and two coating portions 6 (as lower units) are disposed. The second wafer transferring portion 22 is vertically movable, rotatable around the vertical axis, and protrusible and retractable. The second wafer transferring portion 22 transfers a wafer W among the units on the shelves 5A, 5B, and 5C, the coating portions 6, and the developing portions 23. In this example, the first wafer transferring portion 21 and the second wafer transferring portion 22 compose a wafer transferring means.

Figure 5:
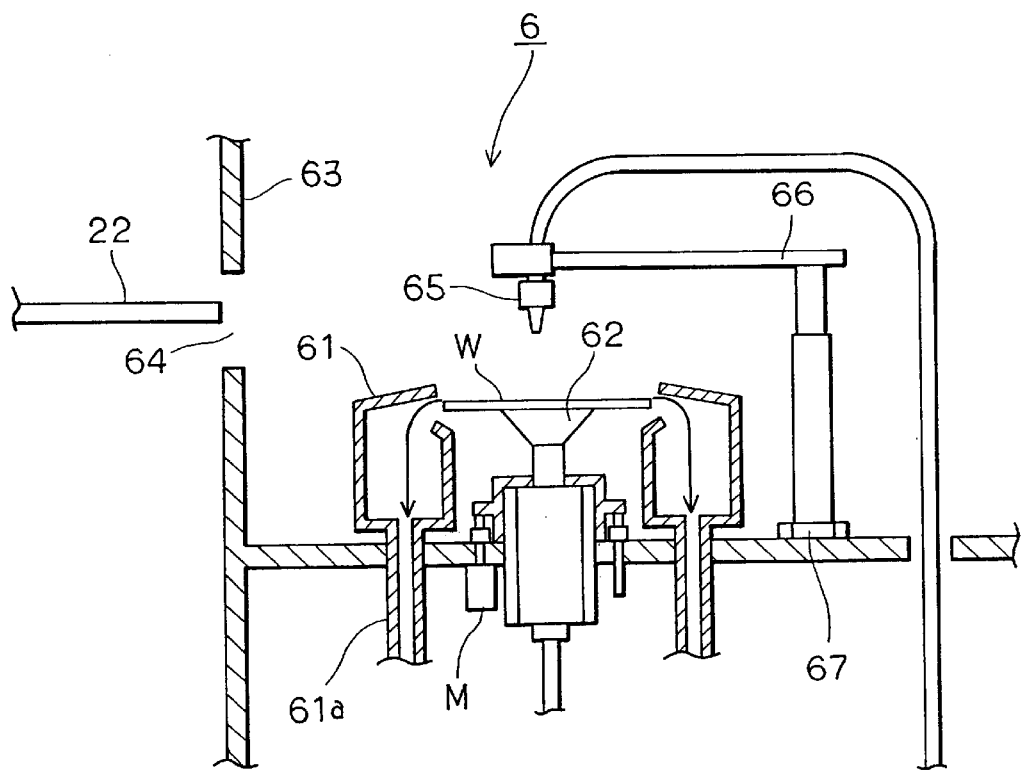
FIG. 5 is a vertical sectional view showing the structure of a coating portion of the system according to the embodiment of the present invention.

The structures of the coating portions 6 and the developing portions 23 are almost the same. For simplicity, only the structure of one of the coating portions 6 will be briefly described with reference to FIG. 5. In FIG. 5, reference numeral 61 is a cup. In the cup 61, an exhaust path 61a is formed. A spin chuck 62 is disposed in the cup 61. The spin chuck 62 is vertically moved by a motor M so that the spin chuck 62 receives a wafer W transferred by the second wafer transferring portion 22 through a transferring opening 64 of a case 63.

A nozzle 61 is disposed at an upper portion of the cup 61. There are two types of nozzles that are a resist nozzle for supplying resist and a solvent nozzle for supplying solvent such as thinner. In FIG. 5, a solvent nozzle 65 is shown. The solvent nozzle 65 supplies thinner to a wafer W so as to wet the wafer W before resist is coated thereon. The solvent nozzle 65 is supported by a supporting arm 66. The solvent nozzle 65 is guided along a rail 67 and moved horizontally (in the vertical direction on the drawing). The resist nozzle is structured in the same manner as the solvent nozzle 65. Resist is supplied from the resist nozzle to the center portion of a wafer W rotated by the spin chuck 62. The resist supplied from the resist nozzle is spread by centrifugal force.

The coating and developing unit 100 has an interface portion 24. The processing portion 3 is connected to the exposing unit 200 through the interface portion 24. The interface portion 24 has a transferring arm 25 that transfers a wafer W between the transferring unit 51 on the shelf 5B and the exposing unit 200.

Figure 6:
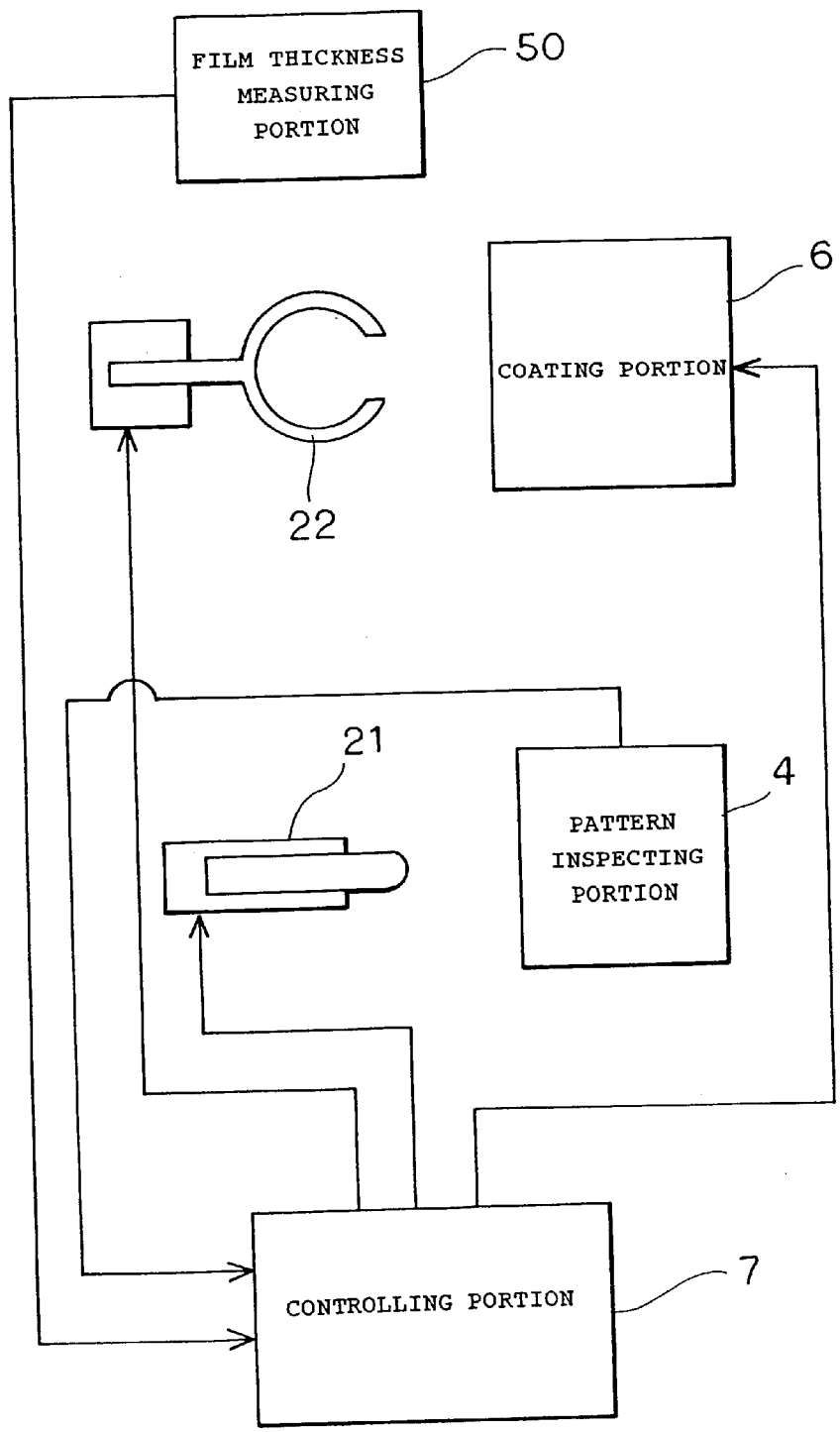
FIG. 6 is a schematic diagram for explaining a controlling portion for a first wafer transferring portion and a second wafer transferring portion of the system according to the embodiment of the present invention.

Next, with reference to FIG. 6, the relation between the results of the pattern inspecting process and the film thickness measuring process of a wafer W and the transfer controlling process for the wafer W will be described. After a wafer W has been developed, the wafer W is transferred to the pattern inspecting portion 4. The pattern inspecting portion 4 inspects a wafer W in the above-described manner. The controlling portion 7 controls the first wafer transferring portion 21 in such a manner that the first wafer transferring portion 21 transfers a wafer W determined as an acceptable wafer to the carrier C placed at the carrier loading and unloading portion 2 and transfers a wafer W determined as an unacceptable wafer to the carrier 40. In addition, the controlling portion 7 controls the second wafer transferring portion 22 in such a manner that the second wafer transferring portion 22 returns a monitor wafer inspected by the film thickness measuring portion 50 to the coating portion 6. As will be described later, the coating portion 6 dissolves and cleans resist on the entire surface of a wafer W with thinner. The controlling portion 7 performs the controlling process corresponding to a program stored therein.

Figure 7:
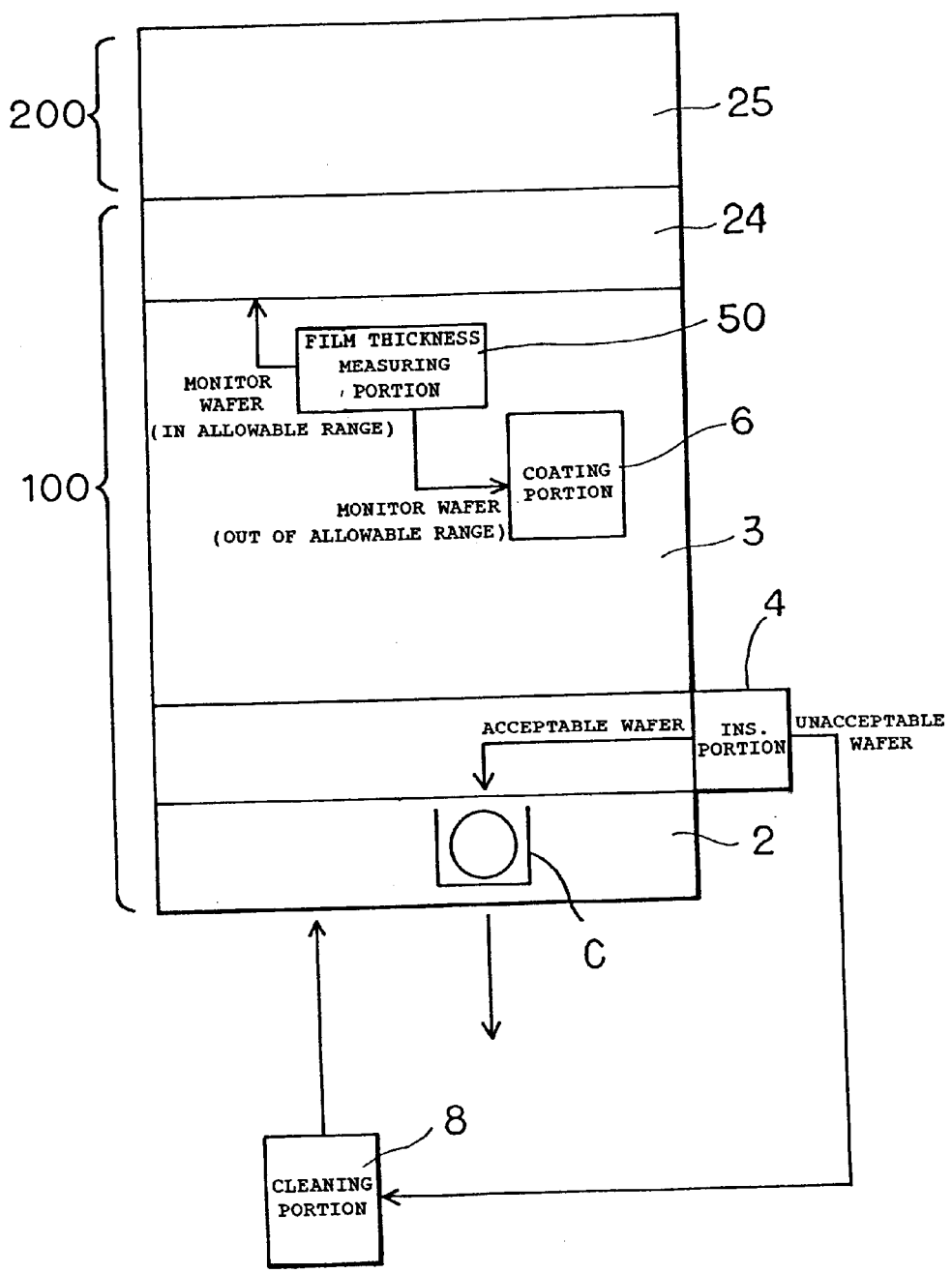
FIG. 7 is a schematic diagram for explaining a substrate regenerating system in coating and developing processes according to the embodiment of the present invention.

The coating and developing unit 100 is structured as described above. Outside the coating and developing unit 100, a cleaning portion 8 is disposed as shown in FIG. 7. The cleaning portion 8 cleans a wafer W determined as an unacceptable wafer by the pattern inspecting portion 4 with chemical solution and removes the pattern from the entire surface of the wafer W.

Next, the operation of the system will be described.

A carrier C is loaded from the outside of the system to the carrier loading and unloading portion 2. The first wafer transferring portion 21 removes a wafer W from the carrier C. The first wafer transferring portion 21 transfers the wafer W to the second wafer transferring portion 22 through the transferring unit 51 on the shelf 5A. The second wafer transferring portion 22 successively transfers the wafer W to processing units on the shelf 5A (5B, or 5C). The processing units perform predetermined processes such as hydrophobic process and cooling process. Thereafter, the coating portion 6 coats resist on the wafer W. The heating portion 6 heats the wafer W. The transferring unit 51 on the shelf 5B transfers the wafer W to the exposing unit 200 through the interface portion 24.

The wafer W exposed in the exposing unit 200 is returned to the processing portion 3 in the reverse path. The second wafer transferring portion 22 transfers the wafer W to the developing portion 23. The developing portion 23 develops the wafer W. In reality, before the wafer W is developed, it is heated and then cooled. The wafer W that has been developed is transferred to the first wafer transferring portion 21 in the reverse path. Thereafter, the wafer W is transferred to the pattern inspecting portion 4. The pattern inspecting portion 4 inspects the line width of the pattern, the alignment of the pattern with the base film, the development irregularity, and the development defect of the wafer W.

As shown in FIG. 7, the first wafer transferring portion 21 returns a wafer W determined as an acceptable wafer to the original carrier C placed at the carrier loading and unloading portion 2. On the other hand, first wafer transferring portion 21 accommodates a wafer W determined as an unacceptable wafer in the carrier C placed below the pattern inspecting portion 4. In other words, the first wafer transferring portion 21 and the carrier 40 separate a wafer W determined as an unacceptable wafer from a wafer W determined as an acceptable wafer.

Thereafter, the carrier C is conveyed to the next station. The carrier 40 is conveyed to the cleaning portion 8 by for example the operator. The cleaning portion 8 has a plurality of chemical tanks. The wafer W is immersed with relevant chemical solution in a chemical tank corresponding to the type of resist of the pattern on the wafer W. Thus, the resist on the entire surface of the wafer W is dissolved and removed. Thus, the wafer W is regenerated to the state before it is loaded to the coating and developing unit 100. The regenerated wafer W is accommodated in the carrier. The carrier is conveyed to the carrier loading and unloading portion 2 of the developing unit 100 by the operator. In the coating and developing unit 100, the coating process, the exposing process, and the developing process are performed.

A monitor wafer is removed from the monitor wafer accommodating portion 52 on the shelf 5B by the second wafer transferring portion 22 so as to periodically check individual processes such as the number of rotations of the spin chuck 62 of the coating and developing system. The monitor wafer is transferred to the coating portion 6. The coating portion 6 coats resist on the monitor wafer. The resultant monitor wafer is transferred to the film thickness measuring portion 50 on the shelf 5B. The film thickness measuring portion 50 measures the film thickness of the resist on the monitor wafer. Thereafter, the monitor wafer is transferred to the coating portion 6. The monitor wafer is sucked by the spin chuck 62. While the monitor wafer is being rotated, thinner as solvent is supplied from the solvent nozzle 65 to the monitor wafer. Thus, the resist on the entire surface of the monitor wafer is dissolved and removed. Thereafter, the monitor wafer is returned to the monitor wafer accommodating portion 50. In the same manner as a product wafer, the monitor wafer may be exposed and developed. Thereafter, the pattern on the monitor wafer may be inspected by the pattern inspecting portion 4.

The above-described embodiment of the present invention has the following effect. The coating and developing unit 100 has the pattern inspecting portion 4. While a wafer W that has been developed is being transferred to the carrier loading and unloading portion 2, the pattern inspecting portion 4 inspects a pattern on the wafer W and separates a wafer determined as an acceptable wafer from a wafer determined as an unacceptable wafer. Thus, the acceptable wafer is accommodated in a carrier C and conveyed to the next station. Thus, in comparison with the case that substrates are removed one by one from a carrier and inspected with an external pattern inspecting portion, the throughput of the system according to the present invention is high.

In addition, according to the above-described embodiment of the present invention, the film thickness of a monitor wafer is measured in the developing unit. The resist film formed on the monitor wafer is removed with thinner supplied from the solvent nozzle of the coating portion 6 and thereby the original monitor wafer is regenerated. Thus, wafers W can be automatically and effectively performed. In this case, the monitor wafer is a bare wafer on which a pattern is not formed on the base. Thus, with thinner supplied from the solvent nozzle and the rotation of the wafer, resist can be securely removed. When the film thickness measuring portion 50 and the monitor wafer accommodating portion 52 are disposed at part of shelf positions on for example the shelf 5B, no extra space is required. Thus, the size of the resist coating and developing unit can be prevented from becoming large.

Figure 8:
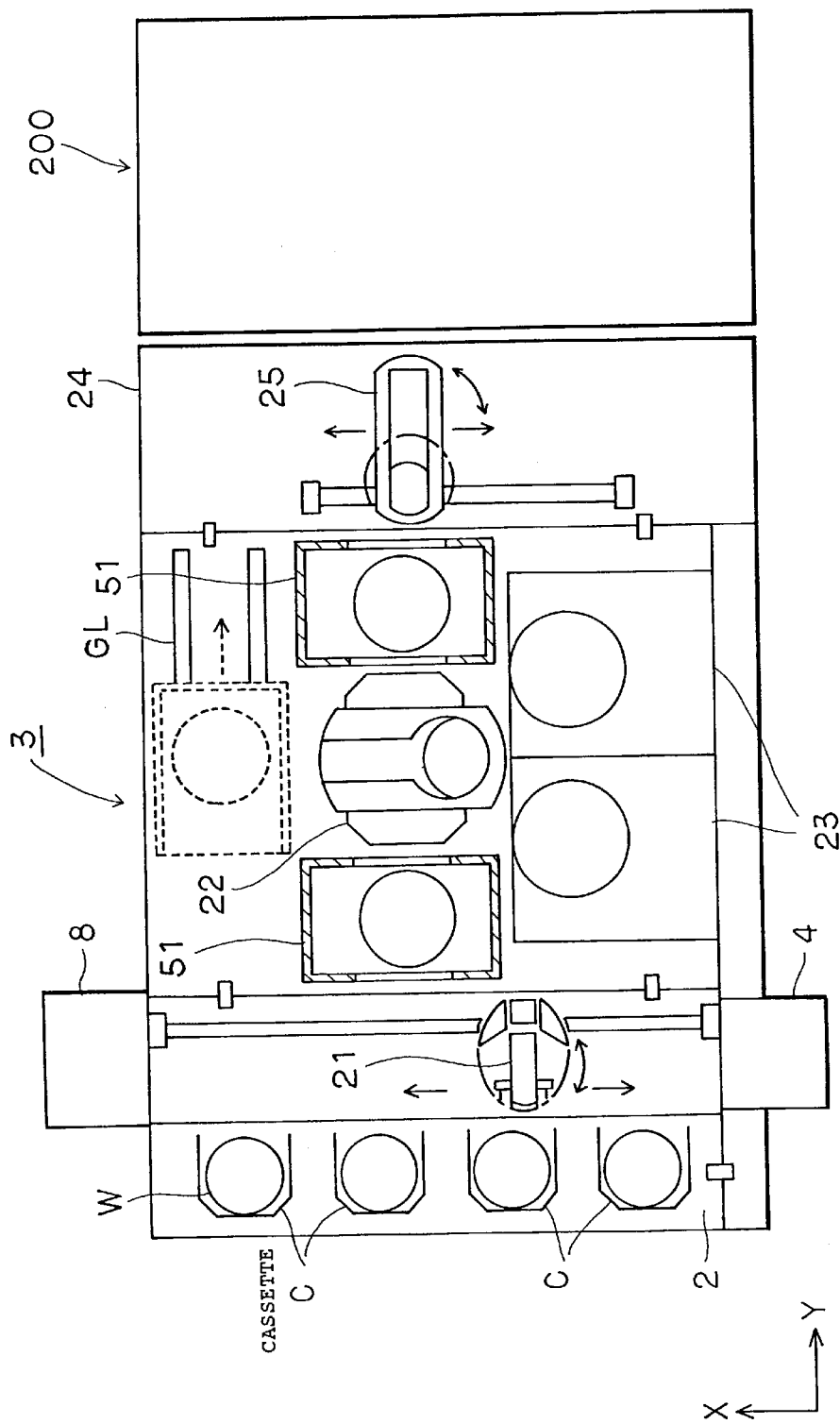
FIG. 8 is a plan view showing the internal structure of a system according to another embodiment of the present invention.

According to the present invention, the cleaning portion 8 may be disposed in the coating and developing unit 100. For example, as shown in FIG. 8, the cleaning portion 8 may be disposed in the transferring region of the first wafer transferring portion 21 on the left of the carrier loading and unloading portion 2 (on the opposite side of the pattern inspecting portion 4). In this case, a product wafer can be automatically regenerated.

Figure 9:
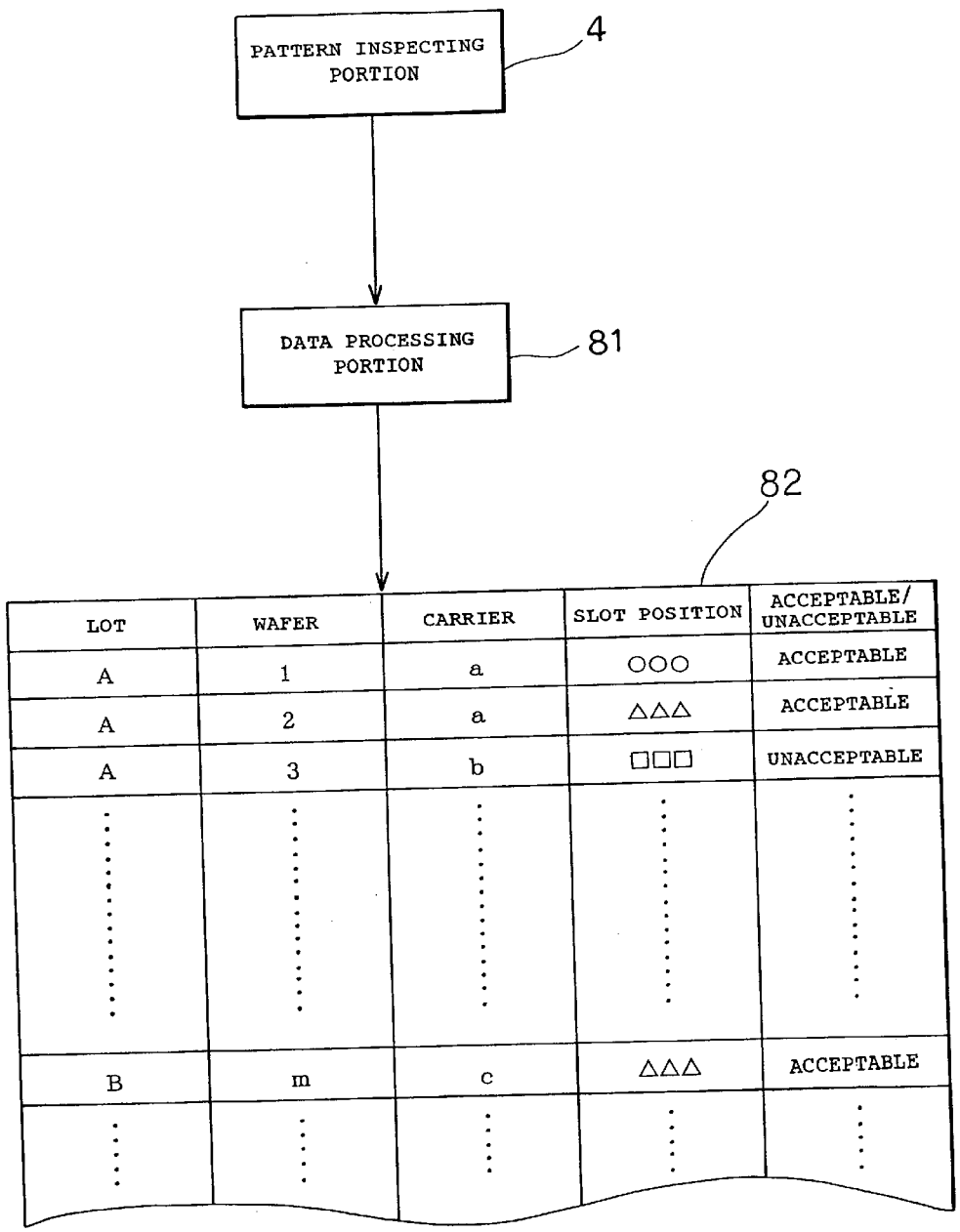
FIG. 9 is a schematic diagram for explaining an example of an acceptable/unacceptable wafer separating method corresponding to a pattern inspected result.

As the separating method for separating a wafer determined as an acceptable wafer from a wafer determined as an unacceptable wafer in the pattern inspecting process, a marking means may be disposed in the pattern inspecting portion 4. In this case, the marking means may drop ink to the peripheral portion of an unacceptable wafer so as to mark the unacceptable wafer. Alternatively, as shown in FIG. 9, the inspected results may be stored in a storing portion 82 through a data processing portion 81. In this case, the storing portion 82 correlatively stores for example wafer identification code, wafer lot identification code, carrier identification code, carrier accommodation position (slot position), and pattern inspected results. Thus, after a carrier C is unloaded, the controlling system of the cleaning portion or the next station can determine whether wafers accommodated in the carrier C are acceptable wafers or unacceptable wafers with reference to data stored in the storing portion 82. Consequently, the next process can be quickly performed for acceptable wafers. In these examples, the marking means and the storing portion 82 are equivalent to the separating means.

Figure 10:
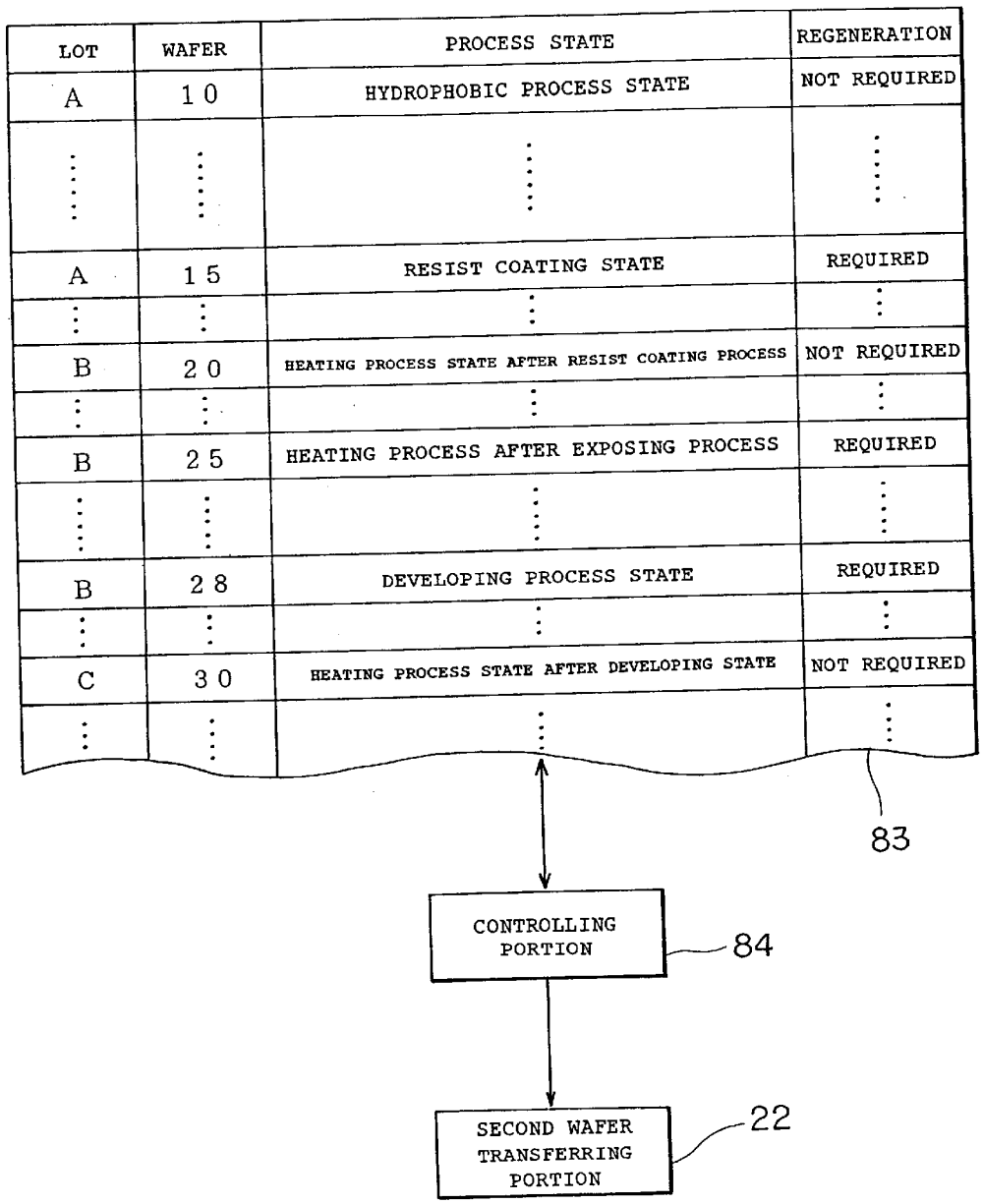
FIG. 10 is a schematic diagram for explaining process history data stored in a storing portion and showing a controlling system including the storing portion according to the present embodiment.

When the coating and developing unit stops due to a trouble or the like, a wafer that has not been completely process is regenerated. Next, with reference to FIG. 10, a preferable regenerating process performed in such a case will be described. A controlling portion 84 receives process history data of each wafer W, correlates each wafer and the process history data, and stores the correlated data to a storing portion 83. In this case, the storing portion 83 stores correlated data of each wafer W and lot identification code. The process history data represents states of for example hydrophobic process, heating process after resist coating process, hating process after exposing process and before developing process, heating process after developing process, and so forth. When the system goes down and stops its processes, the controlling portion 84 determines whether or not to remove resist from each wafer and regenerate it or continue the process with reference to the process history data stored in the storing portion 83 and stores the determined result to the storing portion 83 (the determined result may be stored to the storing portion 83 before the system goes down). Corresponding to the determined result, the controlling portion 84 causes the second wafer transferring portion 22 to transfer a wafer W that should be regenerated to the unacceptable wafer carrier 40. On the other hand, the controlling portion 84 causes the coating and developing unit to continue the regular processes for an acceptable wafer.

When chemically amplifying type resist is used, the process time period of the heating process performed after the exposing process should be strictly controlled. In other words, when such resist is heated for longer than a predetermined time period, a desired developing process cannot be performed. Thus, a wafer that has not been completely heated should be regenerated. In contrast, in the heating process performed after the developing process, the time period of the heating process is not so critical. Thus, even if a wafer W has been completely developed, but not been completely heated, the heating process can be simply continued. Thus, in such a case, it is not necessary to regenerate the wafer. Consequently, when the process history data is managed, it is not necessary to unconditionally regenerate wafers W. Thus, the regenerating process is not required for all wafers W.

Figure 11:
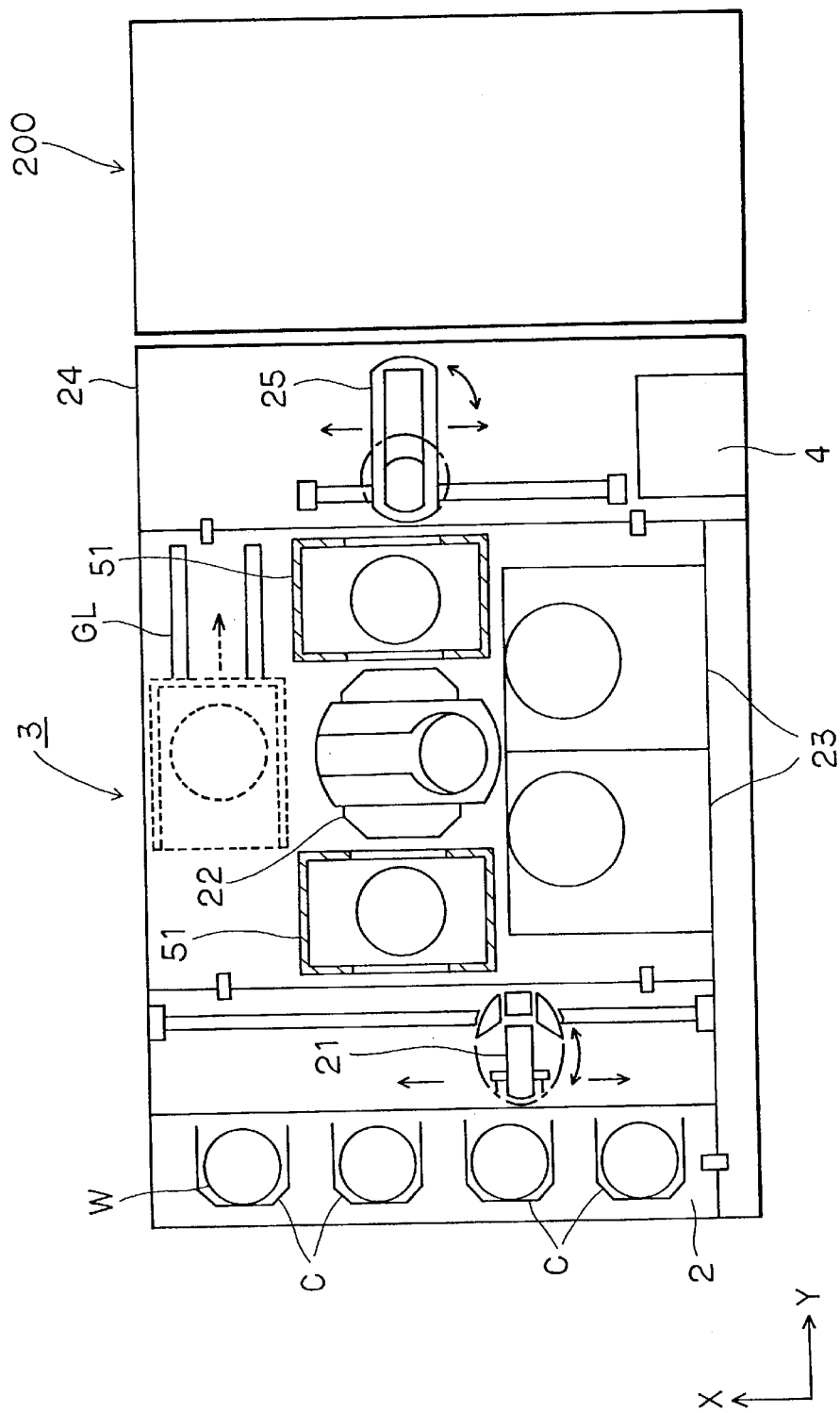
FIG. 11 is a plan view showing the internal structure of a system according to another embodiment of the present invention.

As shown in FIG. 11, the pattern inspecting portion 4 may be disposed in the interface portion 24. Since the interface portion 24 is adjacent to the exposing unit 20, the temperature and humidity of the interface portion 24 are stricter than those of the other portions. Thus, when the pattern inspecting portion 4 is disposed in the interface portion 24, the inspecting process can be more accurately performed.

Figure 12:
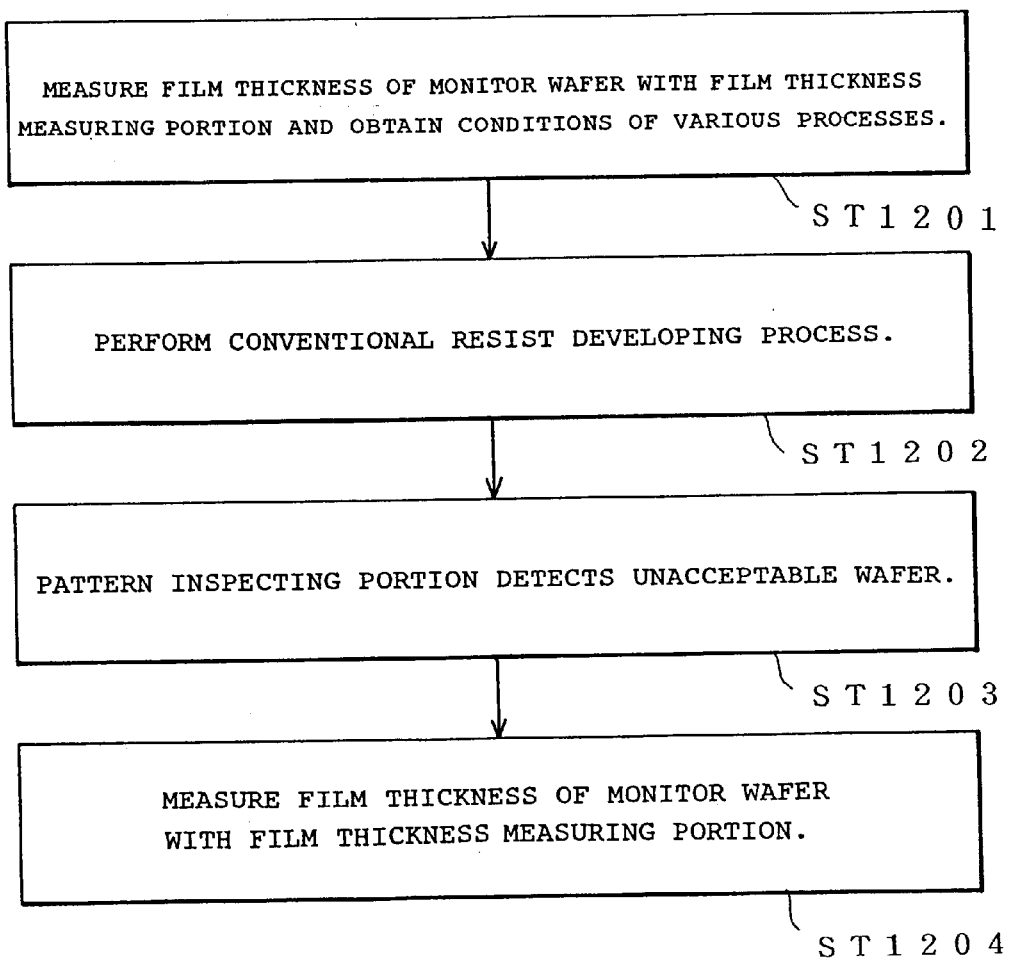
FIG. 12 is a flow chart showing processes of a system according to another embodiment of the present invention.
Figure 13:
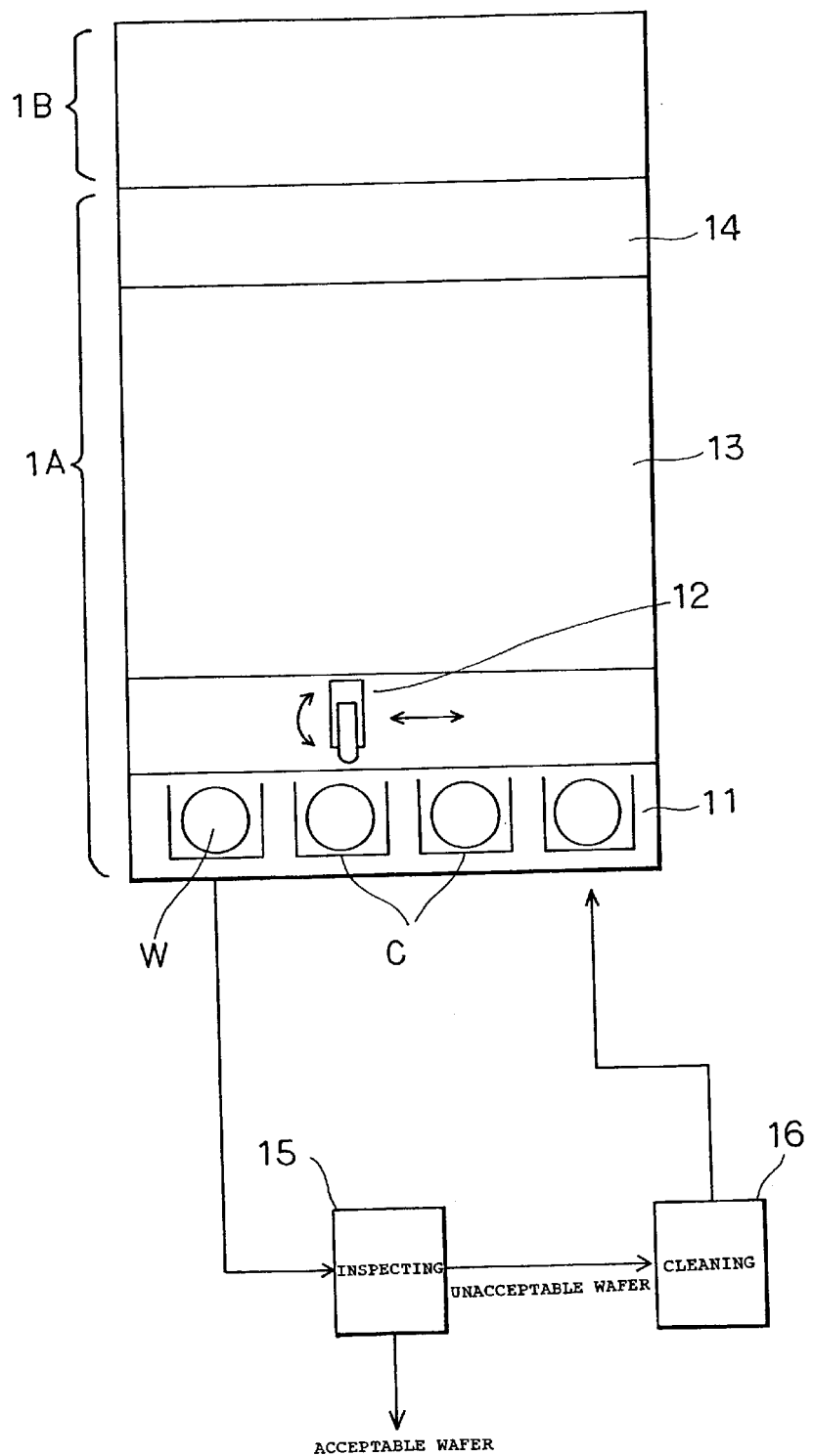
FIG. 13 is a schematic diagram for explaining a substrate regenerating system in conventional coating and developing processes.

In the above-described embodiment, the film thickness of a monitor wafer is periodically measured by the film thickness measuring portion 50. Alternatively, when the coating and developing system is initialized, as shown in FIG. 12, the film thickness of a monitor wafer is measured by the film thickness measuring portion 50. In addition, the conditions of individual processes (such as the number of rotations of the spin chuck 62) are obtained (at step 1201). Thereafter, the resist coating and developing processes are performed for a product wafer W (at step 1202). When the inspected results of product wafers W are unacceptable successfully a plurality of times (at step 1203), the film thickness of a monitor wafer is measured by the film thickness measuring portion 50 (at step 1204). Since the film thickness of a monitor wafer is re-measured by the film thickness measuring portion 50, it can be determined whether the resist coating process, the exposing process, or the developing process is defective. Thus, the cause of unacceptable wafers can be quickly determined.

It should be noted that substrates may be glass substrates for LCD as well as wafers.

As described above, according to the present invention, since the coating and developing unit has a pattern inspecting portion and a film thickness measuring portion, the throughput of the unit is high. In addition, since the coating and developing unit has a cleaning portion or the coating portion has a solvent nozzle for removing resist, wafers can be automatically regenerated.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A coating and developing unit for coating resist on a substrate and developing the resist exposed by a exposing unit connected to the coating and developing unit, the coating and developing unit comprising:

a carrier loading and unloading portion that loads and unloads a carrier that accommodates a plurality of substrates;

a coating portion that applies resist on a substrate removed from a carrier transferred from said carrier loading and unloading portion;

a developing portion that develops the resist on the substrate exposed by said exposing unit and forms a predetermined resist pattern;

a conveyor that transfers the substrate among said carrier loading and unloading portion, said coating portion, and said developing portion;

a pattern inspecting portion that inspects a resist pattern formed on the substrate and determines whether or not the resist pattern is acceptable;

a substrate separator that separates a substrate determined as an unacceptable substrate by said pattern inspecting portion from a substrate determined as an acceptable substrate;

a monitor substrate accommodating portion that accommodates a monitor substrate;

a film thickness measuring portion that measures the film thickness of resist on the monitor substrate and determines whether or not the film thickness of the resist is proper; and a first controller that instructs the conveyor to transfer the monitor substrate accommodated in said monitor substrate accommodating portion to said coating portion and said conveyor to transfer the monitor substrate with resist coated by said coating portion to said film thickness measuring portion, wherein the monitor substrate is used to determine whether a processing condition results in resist in the proper resist film thickness; and wherein the monitor substrate accommodating portion only accommodates the monitor substrate; and wherein the coating and developing unit is an integrated unit.

2. The coating and developing unit as set forth in claim 1, wherein a transferring position is disposed among the carrier, said coating portion, and said developing portion, wherein said conveyor has:

a first transferring portion that transfers a substrate between the carrier and the transferring position; and a second transferring portion that transfers the substrate among the transferring position, said coating portion, and said developing portion, and wherein said pattern inspecting portion is disposed in a transferring range of which said first transferring portion transfers the substrate.

3. The coating and developing unit as set forth in claim 1, wherein said substrate separator includes:

an unacceptable substrate carrier that accommodates substrate determined as unacceptable substrates; and said conveyor, and wherein said conveyor returns a substrate determined as an acceptable substrate to a carrier placed at said carrier loading and unloading portion and transfers a substrate determined as an unacceptable substrate to the unacceptable substrate carrier.

4. The coating and developing unit as set forth in claim 1, wherein said substrate separator marks a substrate determined as an unacceptable substrate.

5. The coating and developing unit as set forth in claim 1, wherein said substrate separator is a storing portion that stores correlated information of accommodation positions, carriers, and unacceptable substrates.

6. The coating and developing unit as set forth in claim 5, wherein said storing portion is a database.

7. The coating and developing unit as set forth in claim 5, wherein said storing portion is a memory.

8. The coating and developing unit as set forth in claim 5, wherein said storing portion is a memory that stores a database.

9. The coating and developing unit as set forth in claim 1, wherein said coating portion has a solvent supply portion that supplies solvent to the monitor substrate, and wherein resist on the monitor substrate is measured by said film thickness measuring portion and removed with solvent supplied by said solvent supplying portion so as to regenerate the monitor substrate.

10. The coating and developing unit as set forth in claim 1, further comprising:

a heating portion that heats a substrate before and after resist is coated or before and after the substrate is developed; and a cooling portion that cools the substrate heated by said heating portion, wherein at least one of said heating portion and said cooling portion is arranged on a plurality of shelf positions of a shelf, said film thickness measuring portion being disposed at one shelf position of the shelf.

11. The coating and developing unit as set forth in claim 1, further comprising:

process history storing portion that stores process history data of each substrate; and a second controller that receives data stored in said process history storing portion and determines whether or not to remove resist on a substrate whose process has not been completely performed due to a stop of the coating and developing unit so as to regenerate the substrate.

12. The coating and developing unit as set forth in claim 1, further comprising:

a cleaning portion that cleans a substrate determined as an unacceptable substrate by said pattern inspecting portion and removes resist thereof so as to regenerate the substrate.

13. The coating and developing unit as set forth in claim 1, further comprising:

an interface portion that transfers a substrate between the coating and developing unit and said exposing unit, wherein said pattern inspecting portion is disposed in said interface portion.

14. A coating and developing unit for coating resist on a substrate and developing the resist exposed by a exposing unit connected to the coating and developing unit, the coating and developing unit comprising:

a carrier loading and unloading portion that loads and unloads a carrier that accommodates a plurality of substrates;

a coating portion that applies resist on a substrate removed from a carrier transferred from said carrier loading and unloading portion;

a developing portion that develops the resist on the substrate exposed by said exposing unit and forms a predetermined resist pattern;

a conveyor that transfers the substrate among said carrier loading and unloading portion, said coating portion, and said developing portion;

a monitor substrate accommodating portion that accommodates a monitor substrate;

a film thickness measuring portion that measures the film thickness of resist on the monitor substrate and determines whether or not the film thickness of the resist is proper; and a first controller that instructs the conveyor to transfer the monitor substrate accommodated in said monitor substrate accommodating portion to said coating portion and said conveyor to transfer the monitor substrate with resist coated by said coating portion to said film thickness measuring portion wherein the monitor substrate is used to determine whether a processing condition results in the proper resist film thickness; and wherein the monitor substrate accommodating portion only accommodates the monitor substrate; and wherein the coating and developing unit is an integrated unit.

15. The coating and developing unit as set forth in claim 14, wherein said coating portion has a solvent supplying portion the supplies solvent to the monitor substrate, and wherein resist on the monitor substrate is measured by said film thickness measuring portion and removed with solvent supplied by said solvent supplying portion so as to regenerated the monitor substrate.

16. The coating and developing unit as set forth in claim 14, further comprising:

a heating portion that heats a substrate before and after resist is coated or before and after the substrate is developed; and a cooling portion that cools the substrate heated by said heating portion, wherein at least one of said heating portion and said cooling portion is arranged on a plurality of shelf positions of a shelf, said film thickness measuring portion being disposed at one shelf position of the shelf.

17. A coating and developing unit for coating resist on a substrate and developing the resist exposed by a exposing unit connected to the coating and developing unit, the coating and developing unit comprising:

a carrier loading and unloading portion that loads and unloads a carrier that accommodates a plurality of substrates;

a coating portion that applies resist on a substrate removed from a carrier transferred from said carrier loading and unloading portion;

a developing portion that develops the resist on the substrate exposed by said exposing unit and forms a predetermined resist pattern;

a pattern inspecting portion that inspects a resist pattern formed on the substrate and determines whether or not the resist pattern is acceptable;

a substrate separator that separates a substrate determined as an unacceptable substrate by said pattern inspecting portion from a substrate determined as an acceptable substrate;

a monitor substrate accommodating portion that accommodates a monitor substrate;

a film thickness measuring portion that measures, the film thickness of resist on the monitor substrate and determines whether or not the film thickness of the resist is proper; and a conveyor that transfers a monitor substrate accommodated in said monitor substrate accommodating portion to said coating portion, instructs said coating portion to coat resist on the monitor substrate, conveys the resultant monitor substrate to said film thickness measuring portion, and instructs said film thickness measuring portion to determine whether or not the film thickness of the monitor substrate is proper when a substrate determined by said pattern inspecting portion is unacceptable.

18. The coating and developing unit as set forth in claim 17, further comprising:

a conveyor that transfers a monitor substrate accommodated in said monitor substrate accommodating portion to said coating portion, instructs said coating portion to coat resist on the monitor substrate, conveys the resultant monitor substrate to said film thickness measuring portion, and instructs said film thickness measuring portion to determine whether or not the film thickness of the monitor substrate is proper when the coating and developing unit is initialized.

* * * * *